United States Patent [19]

Stahlhofen

[11] Patent Number: 4,717,640
[45] Date of Patent: Jan. 5, 1988

[54] LIGHT-SENSITIVE MIXTURE, RECORDING MATERIAL PREPARED THEREFROM AND PROCESS FOR USE THEREOF

[75] Inventor: Paul Stahlhofen, Wiesbaden, Fed. Rep. of Germany

[73] Assignee: Hoechst Aktiengesellschaft, Fed. Rep. of Germany

[21] Appl. No.: 807,666

[22] Filed: Dec. 11, 1985

[30] Foreign Application Priority Data

Dec. 12, 1984 [DE] Fed. Rep. of Germany ....... 3445276

[51] Int. Cl.$^4$ .................. G03C 1/60; G03C 1/495
[52] U.S. Cl. .................................. 430/192; 430/165; 430/300; 430/302; 430/309; 430/330; 430/906; 430/909; 430/270
[58] Field of Search .............. 430/192, 193, 175, 906, 430/909, 300, 302, 309, 165

[56] References Cited

U.S. PATENT DOCUMENTS

| | | | |
|---|---|---|---|
| 3,542,816 | 11/1970 | Bestian et al. | 260/347.2 |
| 3,732,105 | 5/1973 | Klupfel | 430/90 G |
| 3,732,106 | 5/1973 | Steppan et al. | 96/115 R |
| 3,779,778 | 12/1973 | Smith et al. | 96/115 R |
| 3,869,292 | 3/1975 | Peters | 96/115 R |
| 3,890,152 | 6/1975 | Ruckert et al. | 430/175 |
| 3,969,118 | 7/1976 | Stahlhofen et al. | 96/91 D |
| 4,101,323 | 7/1978 | Buhr et al. | 96/35 |
| 4,189,320 | 2/1980 | Hsieh | 430/192 |
| 4,247,611 | 7/1981 | Sander et al. | 430/286 |
| 4,248,957 | 2/1981 | Sander et al. | 430/270 |
| 4,250,247 | 2/1981 | Sander et al. | 430/270 |
| 4,266,001 | 5/1981 | Buhr et al. | 430/192 |
| 4,289,838 | 9/1981 | Rowe et al. | 430/192 |
| 4,311,782 | 1/1982 | Buhr et al. | 430/270 |
| 4,387,151 | 6/1983 | Bosse et al. | 430/175 |
| 4,387,152 | 6/1983 | | |
| 4,439,516 | 3/1984 | Cernigliaro et al. | 430/193 |
| 4,493,884 | 1/1985 | Nagano et al. | 430/192 |

FOREIGN PATENT DOCUMENTS

739654 11/1955 United Kingdom .
1561438 2/1980 United Kingdom .

Primary Examiner—Charles L. Bowers, Jr.
Attorney, Agent, or Firm—Schwartz, Jeffery, Schwaab, Mack, Blumenthal & Evans

[57] ABSTRACT

A light-sensitive mixture containing a light-sensitive compound or a light-sensitive combination of compounds, the solubility of which is increased upon exposure, and a binder made from a polymer which has units of alkenylsulfonylaminocarbonyloxystyrenes or cycloalkenylsulfonylaminocarbonyloxystyrenes and which is insoluble in water and soluble in aqueous alkali. Moreover, a recording material is described which is particularly used in the production of printing plates coated with a light-sensitive layer of the indicated mixture. The printing form obtained after exposure and development of the material can be baked at temperatures ranging from 180° C. to 250° C. without forming difficult to remove deposits on the non-image areas of the plate. As a result, a printing form is produced, which has a particularly high resistance and yields a large print run.

15 Claims, No Drawings

LIGHT-SENSITIVE MIXTURE, RECORDING MATERIAL PREPARED THEREFROM AND PROCESS FOR USE THEREOF

BACKGROUND OF THE INVENTION

The present invention relates to a positive-working light-sensitive mixture which is especially suitable for use in the production of lithographic printing plates.

Positive-working light-sensitive mixtures on a basis of 1,2-naphthoquinone diazides, which can be used in the production of printing plates, have been known for a long time. Mixtures comprising compounds which form strong acids upon exposure and compounds which can be split by acid, for example, acetals and orthocarboxylic acid esters, have also recently been described for the same application, for example, in German Offenlegungsschriften No. 26 10 842 and No. 27 18 254. These mixtures preferably contain a binder which is insoluble in water and soluble in aqueous alkaline solutions, by preference a novolak.

Printing forms which are obtained by exposing and developing light-sensitive materials of this kind yield considerably larger print runs, when the developed plates are heated for some minutes to temperatures in the range from 200° C. to 250° C. In the case of light-sensitive layers containing novolaks as the binders, this heat treatment gives rise to an oleophilic deposit in the non-image areas, which consists of decomposition products of the image areas and can only be removed again by a thorough treatment with alkaline solutions.

According to published European Patent Application No. 111 274, this disadvantage can be obviated by using a halogenated polyvinylphenol as the binder. When a printing form containing a binder of this type is heated or baked respectively, there are no deposits formed in the non-image areas. However, these plates have the disadvantage that their image areas are sensitive to alkaline solutions, for example, to the developer acting over a prolonged period or to a dampening solution containing a small proportion of alkali, and they are attacked by these solutions. Usually, this will become evident as a reduction of print run.

It is known from U.S. Pat. No. 3,869,292 to use polyvinylphenol itself as the alkali-soluble binder. Compared with novolaks, polyvinylphenol has advantages for special applications.

Other alkali-soluble binders have only been disclosed as constituents of negative-working light-sensitive materials. Published European Patent Application No. 48 876, for example, describes mixtures comprising diazonium salt polycondensation products and polymers, for example polyvinyl acetals, with sulfonylurethane side groups, for use in the production of negative-working printing plates. It has been found that the alkali-soluble polymers described in this publication cannot be used in positive-working layers, for example, layers based on 1,2-quinone diazides, since they are too readily soluble in aqueous alkali, and the layers produced will therefore have an insufficient developer resistance and yield print runs which are too short.

SUMMARY OF THE INVENTION

It is accordingly an object of the present invention to provide a positive-working light-sensitive mixture which is suitable for use in the production of lithographic printing plates.

It is another object of the invention to provide a mixture, as above, which has a high developer resistance and yields a long print run.

It is yet another object of the invention to provide a mixture, as above, which can be baked after development without contamination of the image background.

Still another object of the invention is to provide a recording material made from the above light-sensitive mixture.

Yet another object of the invention is to provide a process for producing lithographic printing forms using the above recording material.

These objects are achieved by a light-sensitive mixture comprising at least one light-sensitive compound having an increased solubility upon exposure to light, and a binder comprising a polymer of a styrene derivative, the derivative being selected from the group consisting of an alkenylsulfonylamino-carbonyloxystyrene and a cycloalkenylsulfonylamino-carbonyloxystyrene, wherein the derivative is insoluble in water and soluble in aqueous alkali.

The objects of the invention are also achieved by a recording material produced with the above mixture, and by a process for producing lithographic printing forms which includes the steps of imagewise exposing a light-sensitive recording material, washing away the exposed areas of the light-sensitive layer with an aqueous-alkaline developer solution, and heating the developed and dried printing form to a temperature of from about 180° C. to about 250° C. for a period of from about 1 to about 20 minutes.

DETAILED DESCRIPTION OF THE PREFERRED EMBODIMENTS

According to the invention, a light-sensitive mixture is provided, which contains a light-sensitive compound or a light-sensitive combination of compounds, the solubility of which is increased upon exposure and a binder comprising a polymer of a styrene derivative, which is insoluble in water and soluble in aqueous alkali.

The mixture of the present invention is characterized in that the binder comprises units of alkenylsulfonylaminocarbonyloxystyrenes or of cycloalkenylsulfonylaminocarbonyloxystyrenes.

The invention also provides a light-sensitive recording material which is composed of a support and a light-sensitive layer comprising a light-sensitive mixture of the above-indicated composition.

According to the invention, a process for the production of a lithographic printing form is moreover provided, which comprises the steps of imagewise exposing a light-sensitive recording material of the above-indicated composition, washing away the exposed areas of the light-sensitive layer with an aqueous-alkaline developer solution and heating the developed and dried printing form to a temperature ranging from 1 to 20 minutes.

The styrene polymers containing sulfonyl-urethane groups, which are used in the mixture according to the present invention are prepared by reacting polymers containing hydroxystrene units with sulfonlyisocyanates corresponding to the formula

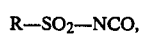

wherein R is an aliphatic or cycloaliphatic radical having at least one olefinic double bond. The radical R generally comprises from 2 to 12 carbon atoms and one olefinic double bond. If R denotes an alkenyl group, the latter preferably has from 2 to 4 carbon atoms; preferred cycloalkenyl groups are those having from 5 to 8 carbon atoms. Examples include vinyl, propenyl, allyl, 1-butenyl-(4), cyclohex-3-en-1-yl, cyclohex-1-enyl, and methyl-cyclohex-3-en-1-yl groups. Propenyl and cyclohexenyl radicals are particularly preferred.

The polymers contained in the mixture of the present invention comprise, linked to the aromatic carbon atoms which carried the hydroxyl groups in the starting polymer, the moiety

wherein the hydrogen atom which is attached to the nitrogen atom is so highly activated by the carbonyl and the sulfonyl groups that it can be split off as a proton by an aqueous alkali; from this fact results developability in aqueous-alkaline developers.

The sulfonylisocyanates which are required for preparing the binders used according to the present invention are described in published European Patent Application No. 48 876 and in German Pat. No. 12 97 601.

The sulfonylisocyanates are reacted with a polymer containing hydroxystyrene units, reaction being advantageously run at a temperature in the range from about 20° to about 40° C. for a period from about 3 to about 4 hours, in an inert solvent, for example dioxane or tetrahydrofuran. In addition to the aromatic hydroxyl group, the hydroxystyrene units can comprise other substituents, such as low molecular weight alkyl or alkoxy groups or halogen atoms. Preferably, the reaction is carried out in such a way that all phenolic groups of the hydroxystyrene units are reacted with the isocyanate. Upon completion of the reaction, the clear solution obtained can be slowly added dropwise to the tenfold quantity of water at room temperature, in order to separate the reaction product. In the process, the reaction product is deposited in the form of a colorless, amorphous, but readily filterable mass. The product is appropriately again suspended in water, removed by filtration and dried.

The starting polymers can be homopolymers or copolymers of o-, m- or p-hydroxystyrenes with other vinyl compounds, for example, styrene, maleic anhydride or maleic acid monoesters, acrylic or methacrylic acid esters. If required, the degree of alkali solubility can be controlled by the proportion of comonomers. In general, the copolymers should comprise at least about 50 mol % of hydroxystyrene units. Although polymers having mean molecular weights (numerical average) between about 3,000 and about 20,000 are preferably employed, polymers of higher or lower molecular weights are also suitable for use.

The concentration of the polystyrene derivatives containing sulfonylurethane groups in the light-sensitive mixture can vary widely, depending upon the nature of the light-sensitive system and the application thereof. Generally they are present in proportions ranging between about 10 and about 80% by weight, preferably between about 20 and 60% by weight, relative to the weight of the non-volatile constituents of the light-sensitive mixture.

The light-sensitive mixtures of the present invention further contain a light-sensitive compound or a light-sensitive combination of compounds. Suitable compounds include positive-working compounds, i.e. those which are rendered soluble by exposure, such as, for example, o-quinone diazides and combinations of photolytic acid donors and compounds which can be split by acid, for example, orthocarboxylic acid compounds and acetal compounds.

The mixture and the process of the present invention have particular advantages in connection with light-sensitive materials based on o-quinone diazides, since the print runs of these materials are particularly largely increased by baking. Suitable materials of this kind are known in the art and are described, for example, in German Pat. No. 938,233 and in German Offenlegungsschriften No. 23 31 377, No. 25 47 905 and No. 28 28 037. The preferred o-quinone diazides include the esters and amides of naphthoquinone-(1,2)-diazide-(2)-4-sulfonic acid or of naphthoquinone-(1,2)-diazide-(2)-5-sulfonic acid. Of these, the esters, especially the ester of 5-sulfonic acid, are particularly preferred. The o-quinone diazide compounds are usually present in a quantity of from about 5 to about 50% by weight, preferably from about 10 to about 30% by weight, relative to the nonvolatile constituents of the mixture.

Materials on a basis of compounds which can be split by acid can also successfully be baked and used in the process according to the present invention. Recording materials of this type are known and described, for example, in U.S. Pat. No. 3,779,778 and U.S. Pat. No. 4,101,323, in German Pat. No. 27 18 254 and in German Offenlegungsschriften No. 28 29 512, No. 28 29 511, and No. 29 28 636. These materials comprise orthocarboxylic acid derivatives, monomeric or polymeric acetals, enol ethers or acyliminocarbonates as the compounds which can be split by acid. The radiation-sensitive, acid-forming compounds contained in these materials predominantly comprise organic halogen compounds, in particular s-triazines, 2-trichloromethyl-1,3,4-oxadizoles or trichloromethylbenzoylmethylenebenzothiazolines, which are substituted by halogenomethyl groups.

Among the orthocarboxylic acid derivatives described in U.S. Pat. No. 4,101,323, the bis-1,3-dioxan-2-yl-ethers of aliphatic diols are especially used.

Among the polyacetals described in German Pat. No. 27 18 254, those containing aliphatic aldehyde units and diol units are preferred.

Other very suitable mixtures are disclosed in German Offenlegungsschrift No. 29 28 636. In this publication, polymeric orthoesters with recurrent orthoester groups in the main chain are described as the compounds which can be split by acid. These groups are 2-alkylethers of 1,3-dioxa-cycloalkanes which have 5 or 6 ring members. Polymers with recurrent 1,3-dioxa-cyclohex-2-yl-alkylether units, in which the alkylether group may be interrupted by ether oxygen atoms and is preferably attached to the 5 position of the adjacent ring, are particularly preferred.

The quantitative proportion of the compounds which can be split by acid in the light-sensitive mixture generally ranges between about 8 and about 65% by weight, preferably between about 14 and about 44% by weight, relative to the non-volatile constitutents of the mixture. The quantity of the acid-forming compound ranges between about 0.1 and about 10% by weight, preferably between about 0.2 and about 5% by weight.

In addition to the polymers containing sulfonylurethane groups, a great number of other resins can be used in the light-sensitive mixtures according to the present invention, for example, vinyl polymers, such as polyvinylacetates, polyacrylates, polyvinylethers, polyvinylacetals, polyvinylpyrrolidones and copolymers of the monomers, on which these resins are based. The preferred resins are novolaks, particularly the relatively highly condensed condensation resins obtained from substituted phenols and formaldehyde or condensation products of phenol derivatives and 4,4'-bis-methoxymethyl-diphenylether. The most advantageous proportion of these resins depends upon the technological requirements and on the influence on developing conditions and usually amounts to not more than about 50% by weight of the polymer containing sulfonylurethane groups. To meet special requirements, such as flexibility, adhesion, gloss, coloration and color change, and the like, the lightsensitive mixture can additionally contain small amounts of substances, for example polyglycols, cellulose derivatives, such as ethylcellulose, wetting agents, dyes, adhesion-promoters and finely divided pigments, and UV absorbers, if required.

For coating a suitable support, the mixtures are generally dissolved in a solvent. The selection of the solvents should be matched to the coating process, the layer thickness and the drying conditions anticipated. Suitable solvents for the mixture according to the invention are ketones, such as methyl ethyl ketone; chlorinated hydrocarbons, such as trichloroethylene and 1,1,1-trichloroethane; alcohols, such a n-propanol; ethers, such as tetrahydrofuran; alcohol ethers, such as ethylene glycol monoethyl ether; and esters, such as butyl acetate. It is also possible to use mixtures which, for special purposes, can also contain solvents, such as acetonitrile, dioxane or dimethylformamide. In principle, any solvents can be used which do not irreversibly react with the layer components.

In most cases the supports used for layer thickness of less than about 10 /μm are metals. The following may be used for offset printing plates: mill-finished, mechanically or electrochemically roughened aluminum which, if desired, has been anodically oxidized and which additionally can also have been chemically pretreated, for example, with polyvinylphosphonic acid, silicates, hexafluorozirconates, hydrolyzed tetraethyl orthosilicate or phosphates.

Coating of the support material is carried out in a known manner by spin-coating, spraying, dipping, by means of rollers or slot dies, by blade-spreading or by means of rollers or slot dies, by blade-spreading or by means of coater application.

Light sources customary in industry are used for exposure. Irradiation with electrons or a laser is another possibility for producing an image.

The aqueous-alkaline solutions used for developing the recording materials, which have a graduated alkalinity, that is, they have a pH which preferably is between about 10 and about 14, and which can also contain minor quantities of organic solvents or wetting agents, remove those areas of the recording layer which have been struck by light, thus producing a positive image of the original.

The preferred use of the light-sensitive mixtures according to the present invention is in the preparation of printing forms, in particular offset printing forms, using metals, in particular aluminum, as the support.

After developing, the printing form can be heated in a known manner. The baking temperatures can be in the range from about 180° C. to about 250° C., preferably from about 200° C. to about 240° C., heating times of from about 1 to about 20 minutes, preferably from about 5 to about 10 minutes being normally required. If the support material is stable at higher temperatures, it is also possible to bake at higher temperatures and to select correspondingly shorter heating times.

The mixture according to the present invention and the light-sensitive recording material prepared therewith have the advantage that practically no baking residues remain in the non-image areas of the support after baking of the finally developed printing forms.

It is therefore possible to dispense with an additional application of a water-soluble protective layer prior to baking or a subsequent removal of residues by treating with a developing solution.

The mixtures of the invention can also be used in the preparation of circuit boards for printed circuits and for similar products. They present a high practical light-sensitivity, a sharp differentiation between image and non-image areas, a high resolution, large print runs, a good compatability with other constituents in the above-indicated customary coating solvents and an easy fog-free developability in aqueous developers which are free from organic solvents.

The invention is explained in more detail by reference to the examples which follow, wherein parts by weight (p.b.w.) are related to parts by volume (p.b.v.) as g to $cm^3$. Unless otherwise stated, percentages are percent by weight.

EXAMPLE 1

123 p.b.w. of a brominated poly-p-hydroxystyrene having a mean molecular weight of 8,000 and a bromine content of 51.6% by weight were dissolved in 200 ml of anhydrous tetrahydrofuran. To this solution, 92 p.b.w. of propenylsulfonylisocyanate (PSI) were added dropwise with thorough stirring, the reaction temperature slightly rising in the process. Upon completion of the PSI addition, stirring was continued for one hour at room temperature and the reaction solution was then refluxed for one hour with continuous stirring. Thereafter, the reaction solution was allowed to cool and was poured into approximately 7,000 p.b.v. of ice water, in the form of a jet which was as thin as possible and while stirring vigorously. Stirring was then continued for another hour. The reaction product was allowed to settle, the supernatant liquid was decanted and the product filtered off by suction. After drying, the polymeric reaction product had a melting range from 80° C. to 100° C.

An electrochemically roughened and anodically oxidized aluminum sheet was coated with a solution of
1.80 p.b.w. of the esterification product obtained from 1 mole of 2,3,4-trihydroxybenzophenone and 3 moles of naphthoquinone-(1,2)-diazide-(2)-5-sulfonic acid chloride.
4.00 p.b.w. of the above-described binder,
0.15 p.b.w. of naphthoquinone-(1,2)-diazide-(2)-4 sulfonic acid chloride, and
0.07 p.b.w. of crystal violet in
40 p.b.w. of ethylene glycol monomethyl ether and
50 p.b.w. of tetrahydrofuran.

The presensitized material so prepared, having a layer weight of about 2.5 $g/m^2$, was imagewise exposed under a transparent positive original and then developed with an .0.25% strength aqueous solution of sodium metasilicate.$9H_2O$. The areas of the recording layer which had been struck by light were removed by developing and the unexposed image areas remained on the support, so that a printing stencil corresponding to the original was obtained. Using an offset printing machine, it was possible to obtain 100,000 flawless prints from the printing form prepared in this manner.

If the condensation product prepared according to Example 1 is replaced by poly-p-vinylphenol ($\overline{M}_w$ 5,300) in the coating solution, the light-sensitive printing plate so produced can no longer be developed after exposure through a transparent original under otherwise identical conditions, i.e. even the portions of the recording layer which have been struck by light remain on the support.

In order to increase the print run and strengthen the printing stencil, the printing form was subjected to a heat treatment. For this purpose, the developed and dried printing form was heated in a baking oven at 230° C. for five minutes. By heating the printing form in the oven, the printing stencil was strengthened and the layer became resistant to chemicals, for example, deletion fluids, and insoluble in organic solvents, such as acetone, alcohols, toluene or xylene.

After the heating operation, the printing stencil was inked with a greasy printing ink in the presence of water. In the process, only the printing stencil accepted ink, while the non-image areas of the printing form repelled ink. In an offset printing machine, 250,000 flawless prints could be produced.

If the brominated poly-4-(propenylsulfonyl-aminocarbonyloxy)-styrene used in Example 1 is replaced by the same quantity of a cresol-formaldehyde novolak and the developed printing form is baked at 230° C. under otherwise identical conditions, severe scum that cannot be removed again forms in the nonimage areas upon inking with a greasy ink, contrary to the printing plate according to the present invention.

In the following examples further coating solutions are specified, which yielded similar results. The preparation and processing of the printing plates obtained with these coating solutions correspond to the conditions described in Example 1, unless otherwise indicated.

EXAMPLE 2

An electrochemically roughened and anodically oxidized aluminum sheet was coated with a solution of 1.60 p.b.w. of the esterification product obtained from 1 mole of 2,3,4-trihydroxybenzophenone and 3 moles of naphthoquinone-(1,2)-diazide-(2)-5-sulfonic acid chloride,
4.00 p.b.w. of the polymeric binder indicated in Example 1,
2.00 p.b.w. of a cresol-formaldehyde novolak having a softening point in the range from 105° C. to 120° C.,
0.15 p.b.w. of naphthoquinone-(1,2)-diazide-(2)-4-sulfonic acid chloride and
0.07 p.b.w. of crystal violet in
40 p.b.w. of ethylene glycol monomethyl ether and
50 p.b.w. of tetrahydrofuran.

The material was further processed as described in Example 1 and a printing stencil corresponding to the positive original was obtained.

EXAMPLE 3

An electrochemically roughened and anodically oxidized aluminum sheet was coated with a solution of 2.40 p.b.w. of a 50% strength solution of a polyorthoester, prepared from 7,7-bishydroxymethyl-5-oxanonan-(1)-ol and trimethylorthoformate, in toluene,
0.23 p.b.w. of 2-(4-ethoxy-naphth-1-yl)-4,6-bis-trichloromethyl-s-triazine,
3.50 p.b.w. of the binder indicated in Example 1 and
0.06 p.b.w of crystal violet base in
40 p.b.w. of ethylene glycol monomethyl ether and
40 p.b.w. of tetrahydrofuran.

The printing plate so prepared was imagewise exposed for 15 seconds under a 5 kW metal halide lamp arranged at a distance of 110 cm and was then developed with an 0.5% strength aqueous solution of sodium metasilicate.

EXAMPLE 4

60 p.b.w. of a poly-p-hydroxystyrene having a mean molecular weight of 10,000 and a melting range from 170° C. to 185° C. were reacted with 75 p.b.w. of propenylsulfonylisocyanate as specified in Example 1. An ocher-colored condensation product having a melting range from 115° C. to 135° C. was obtained.

An electrochemically roughened and anodically oxidized aluminum sheet, the surface of which had been treated with an aqueous solution of polyvinylphosphonic acid, was coated with a solution of 1.60 p.b.w. of the esterification product obtained from 1 mole of 2,3,4-trihydroxybenzophenone and 3 moles of naphthoquinone-(1,2)-diazide-(2)-5-sulfonic acid chloride
6.00 p.b.w. of the above-described reaction product,
0.16 p.b.w. of 2-(acenaphth-5-yl)-4,6-bis-trichloromethyl-s-triazine and
0.07 p.b.w. of crystal violet in
40 p.b.w. of ethylene glycol monomethyl ether and
50 p.b.w. of tetrahydrofuran.

The printing plate obtained was further processed as described in Example 1.

EXAMPLE 5

An electrochemically roughened and anodically oxidized aluminum sheet, the surface of which had been treated with an aqueous solution of polyvinylphosphonic acid, was coated with a solution of 1.50 p.b.w. of the esterification product obtained from 1 mole of 2,3,4,-trihydroxybenzophenone and 3 moles of naphthoquinone-(1,2)-diazide-(2)-5-sulfonic acid chloride,
5.00 p.b.w. of the binder indicated in Example 1,
0.20 p.b.w. of naphthoquinone-(1,2)-diazide-(2)-4-sulfonic acid chloride,
0.07 p.b.w. of crystal violet and
1.00 p.b.w. of a condensation product prepared from 3 moles of 2-methyl resorcinol and 2 moles of 4,4'-bis-(methoxymethyl)-di-phenylether in 1,2-dimethoxyethane in the presence of methane sulfonic acid and having a melting range from 70° C. to 100° C., in
40 p.b.w. of ethylene glycol monomethyl ether and
50 p.b.w. of tetrahydrofuran.

After exposure under a transparent positive original, the printing plate was developed with an 0.5% strength aqueous solution of sodium metasilicate.9H$_2$O. 100,000 good prints could be produced from the printing form thus obtained.

The foregoing description of preferred embodiments has been set forth merely to illustrate the invention and is not intended to be limiting. Since modifications of the described embodiments incorporating the spirit and substance of the invention may occur to persons skilled in the art, the scope of the invention should be limited solely with respect to the appended claims and equivalents.

What is claimed is:

1. A light-sensitive admixture, suitable for use in producing printing plates, consisting essentially of
    at least one positive-working, light-sensitive compound having an increased solubility upon exposure to light, said compound being present in an amount sufficient to impart light-sensitivity to said mixture and being at least one 1,2-quinone diazide;
    a binder polymer of a styrene derivative selected from the group consisting of an alkenylsulfonylaminocarbonyloxystyrene and cycloalkenylsulfonylaminocarbonyloxystyrene, wherein said polymer (a) is insoluble in water and soluble in aqueous alkali and (b) is present in an amount such that the mixture forms a layer when coated from solution onto a support.

2. A light-sensitive mixture is claimed in claim 1, wherein said alkenylsulfonylaminocarbonyloxy group and said cycloalkenylsulfonylaminocarbonyloxy group are in the 4-position of the styrene nucleus.

3. A light-sensitive mixture as claimed in claim 1, wherein said binder is present in an amount ranging from about 10% to about 80% by weight.

4. A light-sensitive mixture as claimed in claim 3, wherein said amount of said binder ranges from about 20% to about 60% by weight.

5. A light-sensitive mixture as claimed in claim 1, wherein said styrene derivative is prepared by reacting at least one polymer containing hydroxystyrene units with at least one sulfonylisocyanate selected from the group consisting of

R—SO$_2$—NCO

R being an aliphatic or cycloaliphatic radical having at least one olefinic double bond.

6. A light-sensitive mixture as claimed in claim 5, wherein R has from 2 to 12 carbon atoms.

7. A light-sensitive mixture as claimed in claim 5, wherein R is an alkenyl group having from 2 to 4 carbon atoms.

8. A light-sensitive mixture as claimed in claim 5, wherein R is a cycloalkenyl group having from 5 to 8 carbon atoms.

9. A light-sensitive mixture as claimed in claim 5, wherein R is selected from the group consisting of vinyl, propenyl, allyl, 1-butenyl-(4), cyclohex-3-en-1-yl, cyclohex-1-enyl, and methyl-cyclohex-3-en-1-yl.

10. A light-sensitive mixture as claimed in claim 5, wherein R is propenyl or cyclohexenyl.

11. A light-sensitive mixture as claimed in claim 1, wherein said mixture further contains at least one additional resin selected from the group consisting of a vinyl polymer, a polyacrylate, a polyvinyl ether, a polyvinylacetal, a polyvinylpyrrolidone and copolymers of two or more of the above.

12. A light-sensitive mixture as claimed in claim 11, wherein said additional resin is a novolak obtained as the condensation product of a substituted phenol and formaldehyde.

13. A light-sensitive mixture as claimed in claim 11, wherein said additional resin is a novolak obtained as the condensation product of a phenol derivative and 4,4'-bis-methoxymethyl-diphenylether.

14. A light-sensitive mixture as claimed in claim 11, wherein said additional resin is present in said mixture in an amount not greater than about 50% by weight of said binder.

15. A light-sensitive recording material, suitable for use in producing printing plates, comprising:
    a support; and
    a light-sensitive layer provided on a surface of said support, said layer comprising a positive-working, light-sensitive admixture consisting essentially of (i) at least one positive working light-sensitive compound having increased solubility upon exposure to light, said compound being present in an amount sufficient to impart light-sensitivity to said mixture and being at least one 1,2-quinone diazide, and (ii) a binder comprising a polymer of styrene derivative which (a) is insoluble in water and soluble in aqueous alkali and (b) is present in an amount such that said mixture forms a layer when coated from solution onto said support, said polymer comprising units selected from the group consisting of an alkenylsulfonylaminocarbonyloxystyrene and a cycloalkenylsulfonylaminocarbonyloxystyrene.

* * * * *